United States Patent
Derrickson et al.

(10) Patent No.: US 12,495,623 B2
(45) Date of Patent: Dec. 9, 2025

(54) LATERAL PHOTOTRANSISTOR

(71) Applicant: GlobalFoundries U.S. Inc., Malta, NY (US)

(72) Inventors: Alexander M. Derrickson, Saratoga Springs, NY (US); Uppili S. Raghunathan, Essex Junction, VT (US); Vibhor Jain, Williston, VT (US); Yusheng Bian, Ballston Lake, NY (US); Judson R. Holt, Ballston Lake, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 373 days.

(21) Appl. No.: 18/075,908

(22) Filed: Dec. 6, 2022

(65) Prior Publication Data

US 2024/0186441 A1 Jun. 6, 2024

(51) Int. Cl.
*H10F 30/24* (2025.01)
*H10F 71/00* (2025.01)
*H10F 77/122* (2025.01)
*H10F 77/40* (2025.01)

(52) U.S. Cl.
CPC ....... *H10F 30/245* (2025.01); *H10F 71/1212* (2025.01); *H10F 77/122* (2025.01); *H10F 77/413* (2025.01)

(58) Field of Classification Search
CPC .. H10F 30/245; H10F 71/1212; H10F 77/122; H10F 77/413; H10F 77/147
See application file for complete search history.

(56) References Cited

U.S. PATENT DOCUMENTS

| | | | |
|---|---|---|---|
| 5,027,177 A | 6/1991 | Vasudev | |
| 9,450,381 B1* | 9/2016 | Cai | H10D 10/311 |
| 9,825,157 B1* | 11/2017 | Jain | H10D 62/822 |
| 2004/0036146 A1 | 2/2004 | Wang et al. | |
| 2018/0108763 A1* | 4/2018 | Cai | H10D 10/60 |
| 2021/0057598 A1 | 2/2021 | Hopkins et al. | |
| 2021/0134987 A1* | 5/2021 | Yang | H10D 64/231 |

FOREIGN PATENT DOCUMENTS

WO 2016/168808 10/2016

OTHER PUBLICATIONS

European Search Report and Opinion dated Mar. 22, 2024 in EP Application No. 23199267.8-1002, 9 pages.
V. Sorianello et al., "High responsivity SiGe heterojunction phototransistor on silicon photonics platform", Opt. Express 23, https://opg.optica.org/oe/fulltext.cfm?uri=oe-23-22-28163&id=331391, (2015), 7 pages.

(Continued)

*Primary Examiner* — William B Partridge
*Assistant Examiner* — Felix B Andrews
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to lateral phototransistors and methods of manufacture. The structure includes a lateral bipolar transistor; and a T-shaped photosensitive structure vertically above an intrinsic base of the lateral bipolar transistor.

19 Claims, 5 Drawing Sheets

(56) References Cited

OTHER PUBLICATIONS

R. W. Sandage et al., , "A fingerprint opto-detector using lateral bipolar phototransistors in a standard CMOS process," Proceedings of International Electron Devices Meeting, 1995, doi: 10.1109/IEDM.1995.497207, 4 pages.

Milad Frounchi et al., "High Responsivity Ge Phototransistor in Commercial CMOS Si-Photonics Platform for Monolithic Optoelectronic Receivers," in IEEE Electron Device Letters, vol. 42, No. 2, Feb. 2021, doi: 10.1109/LED.2020.3042941, 4 pages.

\* cited by examiner

LATERAL PHOTOTRANSISTOR

BACKGROUND

The present disclosure relates to semiconductor structures and, more particularly, to lateral phototransistors and methods of manufacture.

A phototransistor is a semiconductor device that is sensitive to light. More specifically, a phototransistor is a specialized form of bipolar transistor that is optimized for light sensitivity. Accordingly, the phototransistor operates by light rather than electric current. The phototransistor devices are ideal for light sensing applications as they can detect light pulses and convert the light pulses into digital electrical signals.

SUMMARY

In an aspect of the disclosure, a structure comprises: a lateral bipolar transistor; and a T-shaped photosensitive structure vertically above an intrinsic base of the lateral bipolar transistor.

In an aspect of the disclosure, a structure comprises: a lateral bipolar transistor comprising a laterally connected intrinsic base, emitter and collector comprising a top semiconductor layer of semiconductor on insulator substrate; a T-shaped photosensitive structure vertically above and in contact with the intrinsic base; and a spacer isolating the T-shaped photosensitive structure from both the emitter and the collector.

In an aspect of the disclosure, a method comprises: forming a lateral bipolar transistor comprising a laterally connected intrinsic base, emitter and collector comprising a top semiconductor layer of a semiconductor on insulator substrate; forming a T-shaped photosensitive structure vertically above and in contact with intrinsic base; and forming a spacer isolating the T-shaped photosensitive structure from both the emitter and the collector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to lateral phototransistors and methods of manufacture. More specifically, the present disclosure relates to waveguide compatible lateral phototransistors and methods of manufacture. Advantageously, the waveguide compatible lateral phototransistor allows for optimization of an area of light absorbing material, e.g., Ge, without losing performance due to intrinsic base widening, in addition to providing a high performance device in semiconductor on insulator technology. For example, the waveguide compatible lateral phototransistor can couple light and create an electrical signal with responsivity of greater than 1.

In more specific embodiments, the lateral phototransistor may be a lateral bipolar transistor comprising an emitter, base (e.g., extrinsic and intrinsic base) and collector. In embodiments, the lateral phototransistor comprises a photosensitive structure (e.g., Ge) vertically above and in direct contact with the intrinsic base. The waveguide structure may also directly contact the intrinsic base of the lateral bipolar transistor such that the waveguide structure may be coupled to the photosensitive structure (via the intrinsic base). The photosensitive structure may be T-shaped region over the intrinsic base of the lateral bipolar transistor, which effectively increases the volume and light absorption capabilities of the photosensitive structure. In embodiments, impinging light from the waveguide structure creates electron/hole pairs in the T-shaped photosensitive structure.

The lateral phototransistors of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral phototransistors of the present disclosure have been adopted from integrated circuit (IC) technology. For example, the structures are built on wafers and are realized in films of material patterned by photolithographic processes on the top of a wafer. In particular, the fabrication of the lateral phototransistors uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1A:
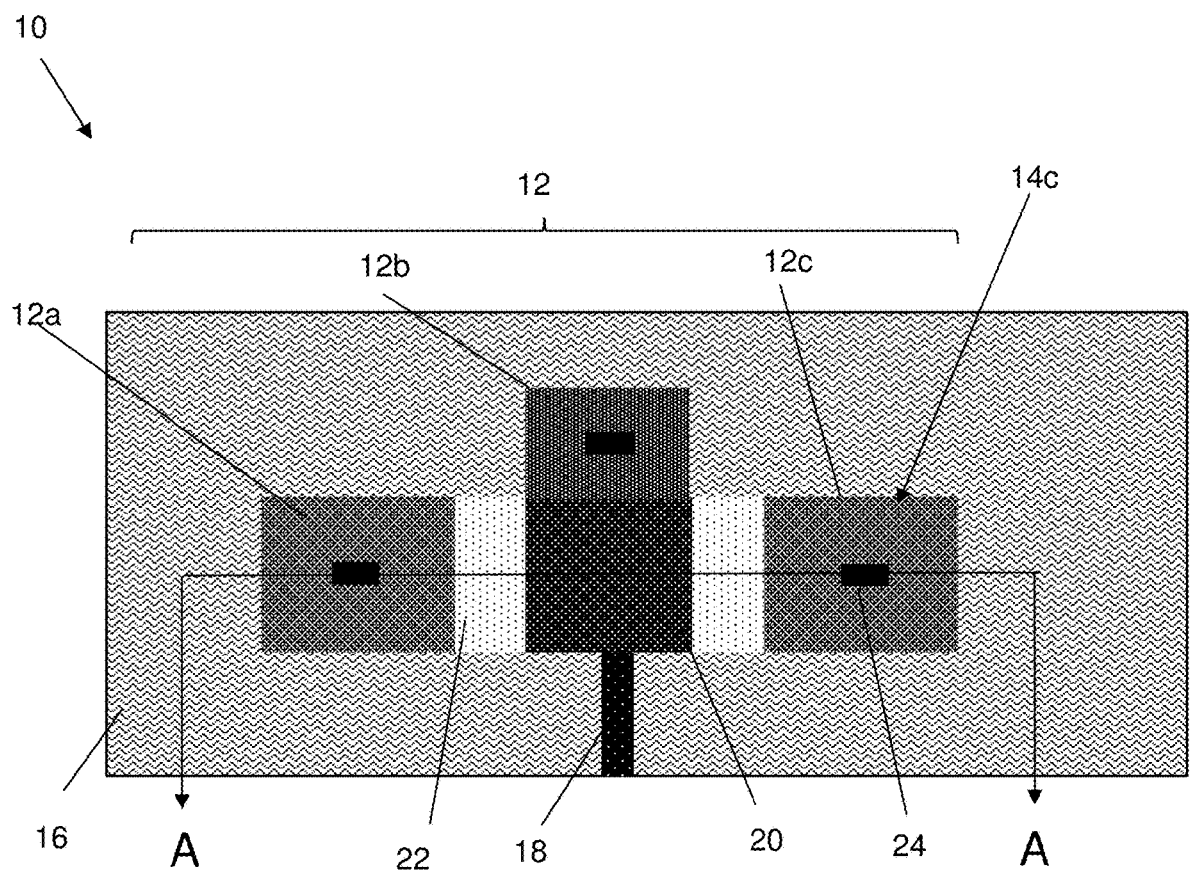
FIG. 1A shows a top view of a lateral phototransistor, amongst other features, and respective fabrication processes in accordance with aspects of the present disclosure.
Figure 1B:
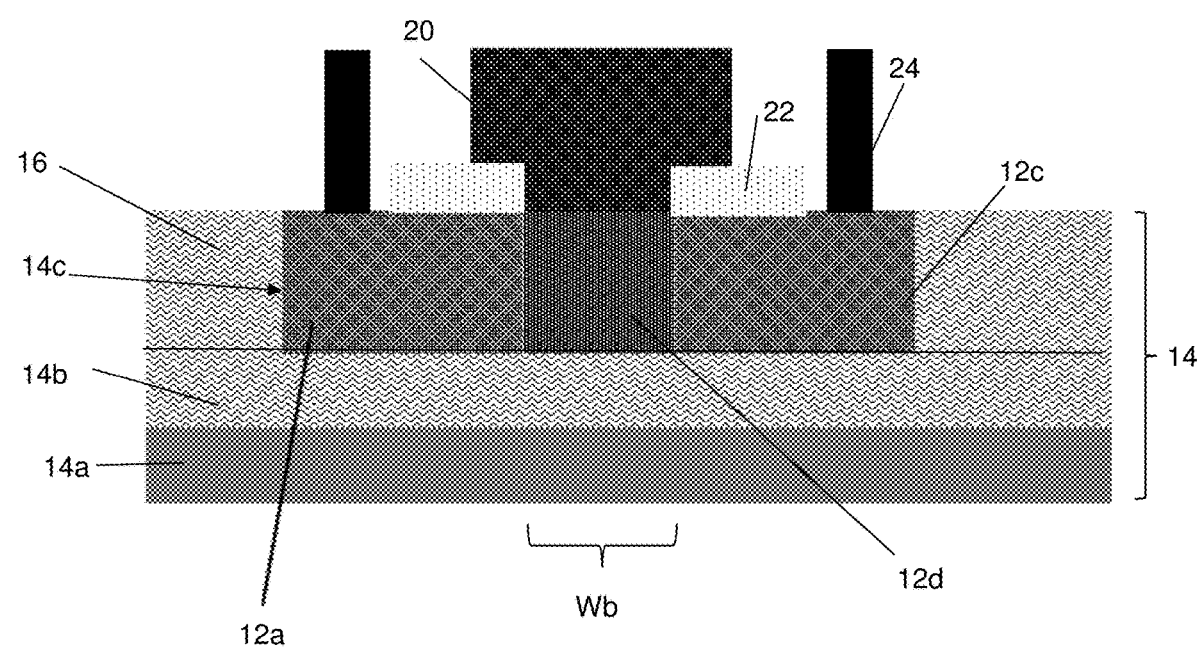
FIG. 1B shows a cross-sectional view of the lateral phototransistor of FIG. 1A, along line A-A.

FIG. 1A shows a top view of a lateral phototransistor, amongst other features, and respective fabrication processes in accordance with aspects of the present disclosure. FIG. 1B shows a cross-sectional view of the lateral phototransistor of FIG. 1A, along line A-A. Referring to FIGS. 1A and 1B, the structure 10 comprises a bipolar transistor 12 formed on a semiconductor substrate 14. The bipolar transistor 12 may be surrounded by and electrically isolated by shallow trench isolation structures 16. A waveguide structure 18 may be coupled to the bipolar transistor 12 and more specifically to a photosensitive structure 20 on the bipolar transistor 12 as described in more detail herein.

In embodiments, the semiconductor substrate 14 may be semiconductor on insulator technology comprising, from bottom to top, a handle substrate 14a, a buried insulator layer (i.e., buried oxide layer) 14b and a top semiconductor layer 14c. The insulator layer (i.e., buried oxide layer) 14b and shallow trench isolation structures 16 may provide optical isolation for the waveguide structure 18. The handle substrate 14a provides mechanical support to the buried insulator layer 14b and the top semiconductor layer 14c.

The handle substrate 14a and top semiconductor layer 14c may include a semiconductor material such as, for example, Si, SiGe, SiC, SiGeC, III-V compound semiconductor, II-VI compound semiconductor or any combinations thereof. Typically, each of the handle substrate 14a and the top semiconductor layer 14c comprises a single crystalline semiconductor material, such as, for example, single crystalline silicon. The buried insulator layer 14b may include a dielectric material such as silicon dioxide, silicon nitride, silicon oxynitride, boron nitride or a combination thereof. In one preferred embodiment, the buried insulator layer 14b may be a buried oxide layer (e.g., BOX) formed by a deposition process, e.g., chemical vapor deposition (CVD), plasma enhanced chemical vapor deposition CVD (PECVD) or physical vapor deposition (PVD) or, alternatively, a thermal growth process, such as thermal oxidation or by implanting oxygen atoms into a bulk semiconductor substrate and thereafter annealing the structure.

Still referring to FIG. 1, the bipolar transistor 12 may comprise a laterally connected collector 12a, extrinsic base 12b, emitter 12c and intrinsic base 12d. The extrinsic base 12b contacts the intrinsic base 12d, perpendicularly from the emitter 12c and collector 12a. The intrinsic base 12d may be provided between the collector 12a and the emitter 12c. In embodiments, the collector 12a, extrinsic base 12b, emitter 12c and intrinsic base 12d may be formed by patterning the top semiconductor layer 14c, followed by an ion implantation process.

In alternative embodiments, the intrinsic base 12d may be SiGe or Si, and the extrinsic base 12b may be Ge. In further embodiments, the intrinsic base 12d may have a gradient percent concentration of Ge, with a higher percentage of Ge closest to the photosensitive structure 20. As discussed in more detail below, the collector 12a and emitter 12c comprise p-doped semiconductor material; whereas the intrinsic base 12d comprises n-doped semiconductor material.

In embodiments, the waveguide structure 18 directly couples to, e.g., contacts, the intrinsic base 12d and may be perpendicular to the emitter 12c and collector 12a. Also, the waveguide structure 18 may be isolated using by the shallow trench isolation structures 16 and the buried insulator layer 14b in order to confine light to within the waveguide structure 18. The photosensitive structure 20 may also be provided above the bipolar transistor 12, e.g., intrinsic base 12d, such that the waveguide structure 18 may be directly coupled to the photosensitive structure 20.

The collector 12a, extrinsic base 12b and emitter 12c each include a contact 24. The contact 24 may be any back end of the line (BEOL) metal such as, e.g., copper, aluminum or tungsten. Advantageously, in embodiments, the contact 24 on the extrinsic base 12d may reflect light back into the photosensitive structure 20.

In further embodiments, the photosensitive structure 20 may be 100% Ge material. In embodiments, some of the Ge material may diffuse into the intrinsic base 12d resulting in a gradient concentration of Ge in the intrinsic base 12d. In alternative embodiments, the photosensitive structure 20 may be other photosensitive materials such as TiN or other photosensitive materials depending on the device characteristics, e.g., particular light band (e.g., C-band) used for a particular application. The photosensitive structure 20 may also be vertically positioned above the collector 12a, extrinsic base 12b, emitter 12c and intrinsic base 12d, and may preferably be electrically isolated from the collector 12a and the emitter 12c by insulator material, e.g., spacers 22. In embodiments, the spacers 22 may be nitride, as an example, formed over the collector 12a and the emitter 12c.

As shown in FIG. 1B, the photosensitive structure 20 is a T-shaped structure. The T-shaped structure allows optimization of the area of the photosensitive structure 20 without losing performance due to widening of the intrinsic base 12d. A wider (e.g., laterally extending) photosensitive region may be isolated from the emitter 12c and collector 12a by the spacers 22. In this way, the width of the intrinsic base, Wb, will not be impacted, while being able to improve gain and noise, in addition to maintaining high light absorption.

Figure 2:
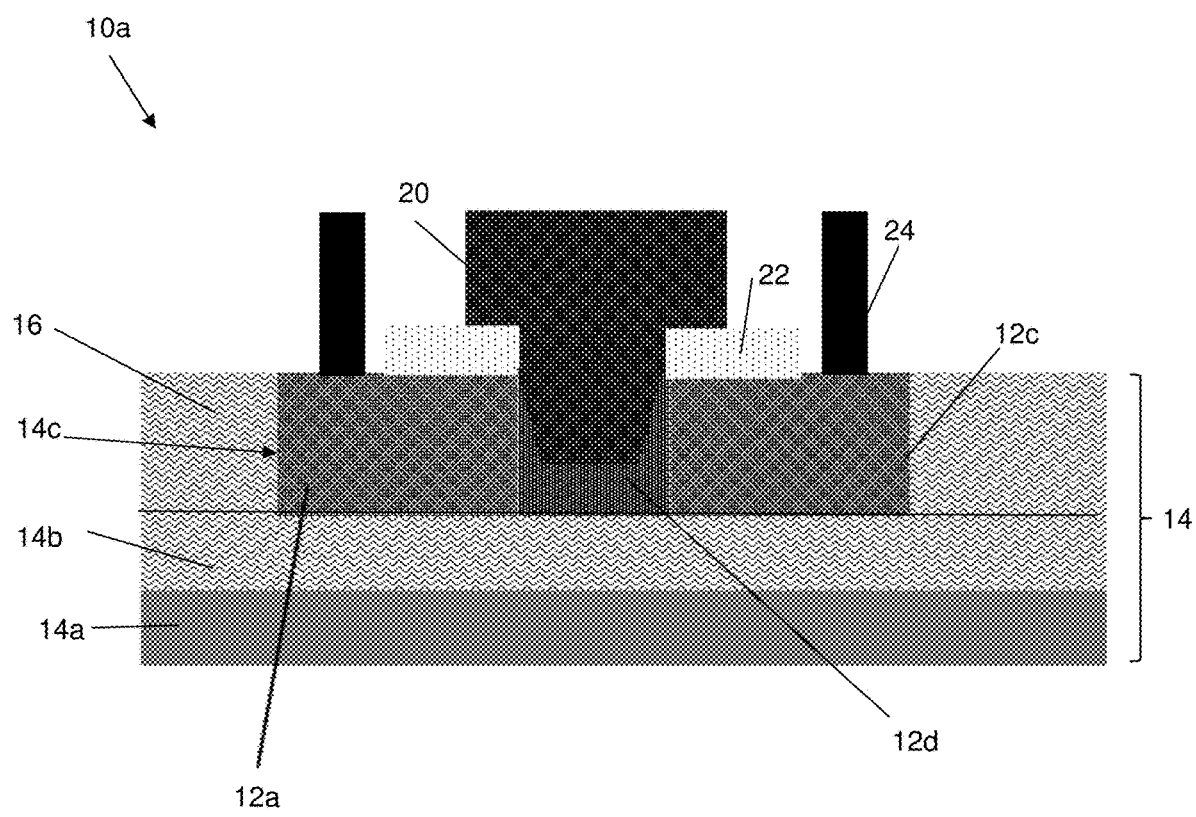
FIG. 2 shows a lateral phototransistor, amongst other features, in accordance with additional aspects of the present disclosure.

FIG. 2 shows a lateral phototransistor in accordance with additional aspects of the present disclosure. In particular, in the structure 10a of FIG. 2, the photosensitive structure 20 extends partly into a trench formed in the intrinsic base 12d. The remaining features of the structure 10a are similar to the structure 10 of FIGS. 1A and 1B.

Figure 3A:
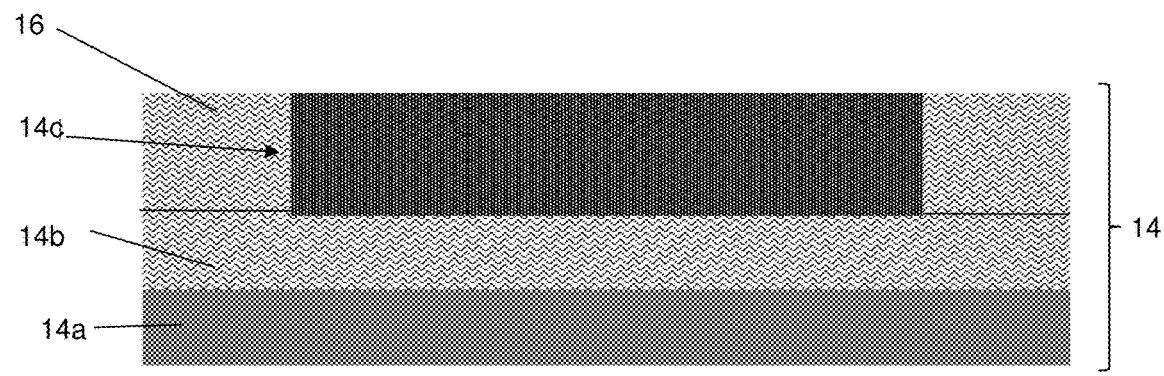
FIGS. 3A-3D show fabrication processes of manufacturing the lateral phototransistor of FIG. 2.

FIGS. 3A-3D show fabrication processes of manufacturing the lateral phototransistor of FIG. 2. For example, FIG. 3A shows the semiconductor substrate 14 with shallow trench isolation structures 16 formed in the top semiconductor layer 14c, above and, in embodiments, extending into the buried insulator layer 14b. The top semiconductor layer 14c may be patterned to form regions for the collector, emitter, intrinsic base and extrinsic base using conventional lithography and etching processes that are also used to form the shallow trench isolation structures 16.

For example, the shallow trench isolation structures 16 can be formed by conventional lithography, etching and deposition methods known to those of skill in the art. For example, a resist formed over the top semiconductor layer 14c is exposed to energy (light) and developed utilizing a conventional resist developer to form a pattern (opening). An etching process with a selective chemistry, e.g., reactive ion etching (RIE), will be used to transfer the pattern from the patterned photoresist layer to the top semiconductor layer 14c to form one or more trenches in the top semiconductor layer 14c through the openings of the resist. Following the resist removal by a conventional oxygen ashing process or other known stripants, the insulator material can be deposited by any conventional deposition processes, e.g., chemical vapor deposition (CVD) processes. Any residual material on the surface of the top semiconductor layer 14c can be removed by conventional chemical mechanical polishing (CMP) processes.

Figure 3B:
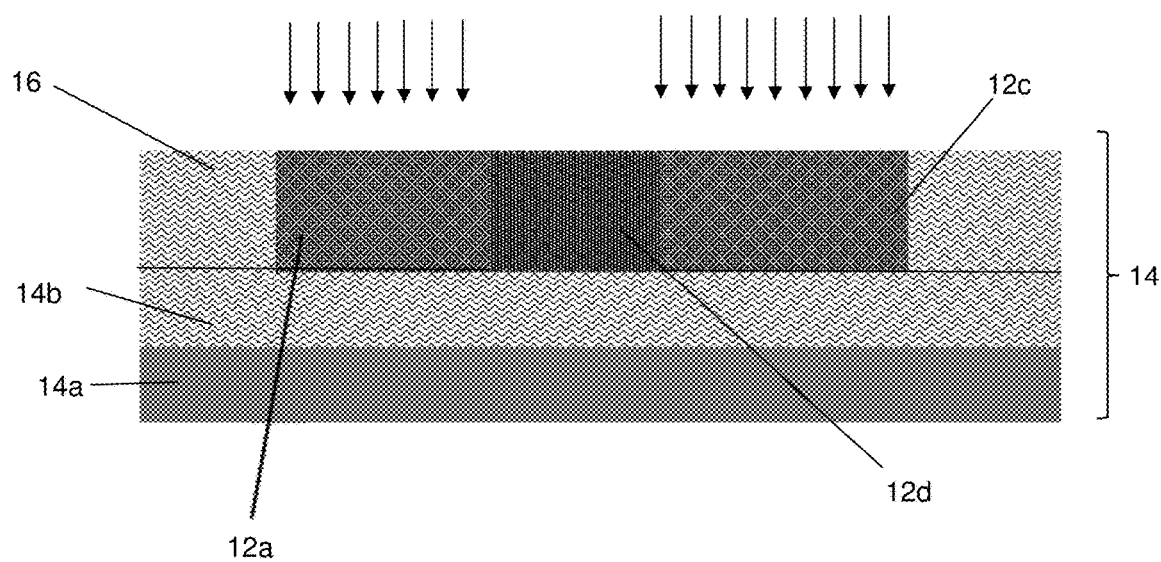

In FIG. 3B, the patterned top semiconductor layer 14c may be subjected to ion implantation processes to form the collector 12a, emitter 12c, and intrinsic base 12d. In embodiments, the intrinsic base 12d may be formed in a different ion implantation process than the collector 12a and emitter 12c. For example, the collector 12a, emitter 12c, and intrinsic base 12d may be formed by introducing a concentration of a different dopant of opposite conductivity type in the patterned top semiconductor layer 14c.

In embodiments, respective patterned implantation masks may be used to define selected areas exposed for the implantations. For example, the implantation mask used to select the exposed area for forming the intrinsic base 12d is stripped after implantation, and before the implantation mask used to form the collector 12a and emitter 12c. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The intrinsic base 12d may be doped with p-type dopants, e.g., Boron (B), and the collector 12a and emitter 12c may be doped with n-type dopants, e.g., Arsenic (As), Phosphorus (P) and Antimony (Sb), among other suitable examples. A thermal annealing process may be used to drive in the dopants.

Figure 3C:
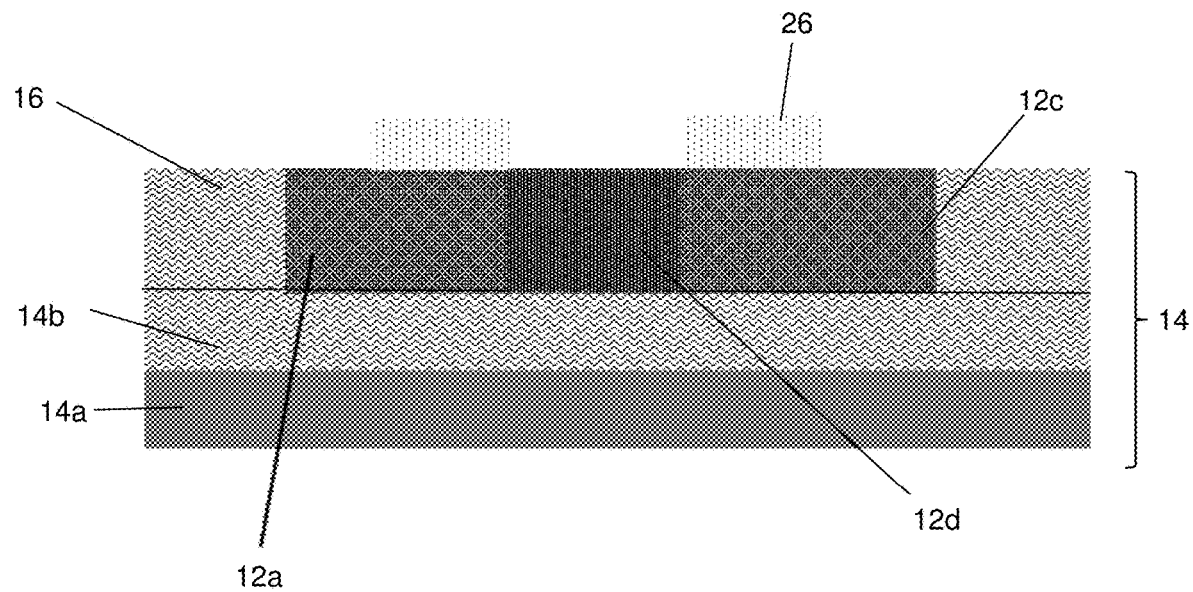

In FIG. 3C, the spacers 26 may be formed over the collector 12a and emitter 12c. By way of example, a nitride material may be blanket deposited on the surface of the collector 12*a*, emitter 12*c*, and intrinsic base 12*d* by a conventional deposition process, e.g., CVD, followed by a patterning process, e.g., lithography and etching, to form the spacers 26 over the collector 12*a* and emitter 12*c*. In embodiments, the width, Wb, of the intrinsic base 12*d* may be minimized due to the use of the spacers 26, while the photosensitive region, e.g., photosensitive structure 20, can be maximized due to the T-shaped configuration.

Figure 3D:
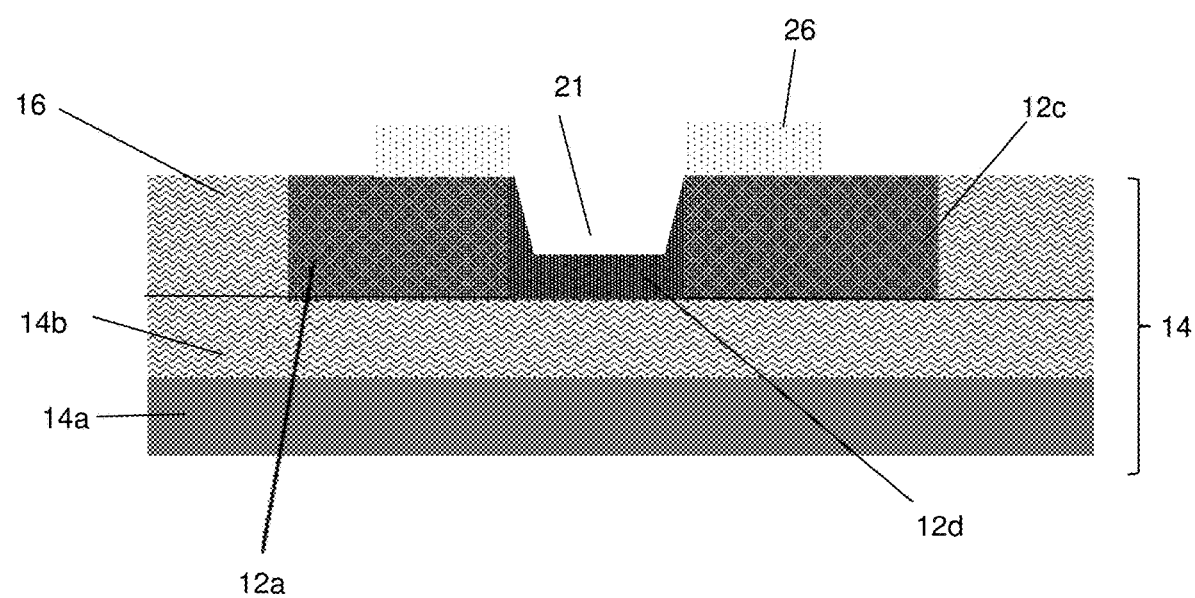

As further shown in FIG. 3D, a trench 21 is formed in the intrinsic base 12*d*. The trench 21 may be formed by conventional patterning processes as is known in the art, e.g., timed etching processes. For the structure 10 shown in FIGS. 1A and 1B, the formation of the trench may be eliminated.

Referring back to FIG. 2, the photosensitive structure 20 may be formed within the trench 21 and laterally over the spacers 22. In embodiments, the photosensitive structure 20 may be formed by a conventional epitaxial growth process as is known in the art. For example, the photosensitive structure 20 will grow from the intrinsic base 12*d* and laterally over the spacers 22. In this way, the photosensitive structure 20 will achieve maximum performance due to an increased volume (e.g., T-shape).

Referring still to FIG. 2, the contacts 24 are formed over the collector 12*a*, extrinsic base 12*b* and emitter 12*c*. The contacts 24 may be formed by conventional back end of the line CMOS processes as is known in the art such that no further explanation is required herein to understand the present disclosure.

Prior to forming the contacts 24, a silicide contact may be provided on the collector 12*a*, extrinsic base 12*b* and emitter 12*c*. In embodiments, the photosensitive structure 20 may be masked to prevent silicide formation on the photosensitive structure 20. In this way, the silicide contact would not impact the light mode of the photosensitive structure 20. Alternatively, the silicide contact may also be formed on the photosensitive structure 20 as there can be a tradeoff between resistance versus total responsivity.

As should be understood by those of skill in the art, the silicide process begins with deposition of a thin transition metal layer, e.g., nickel, cobalt or titanium, over the collector 12*a*, extrinsic base 12*b* and emitter 12*c*. After deposition of the material, the structure is heated allowing the transition metal to react with exposed silicon (or other semiconductor material as described herein) in the active regions of the semiconductor device (e.g., collector 12*a*, extrinsic base 12*b* and emitter 12*c*) forming a low-resistance transition metal silicide. Following the reaction, any remaining transition metal is removed by chemical etching, leaving silicide contacts in the active regions of the device.

The lateral phototransistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising: a lateral bipolar transistor comprising of an intrinsic base; and a T-shaped photosensitive structure extending within a trench of the intrinsic base and vertically above and in direct contact with the intrinsic base of the lateral bipolar transistor.

2. The structure of claim 1, wherein the lateral bipolar transistor comprises the intrinsic base laterally connected to and in between a collector and an emitter.

3. The structure of claim 2, further comprising an extrinsic base perpendicular to the intrinsic base, the collector and the emitter.

4. The structure of claim 2, wherein the T-shaped photosensitive structure is in contact with the intrinsic base of the lateral bipolar transistor within the trench.

5. The structure of claim 4, further comprising spacers between the T-shaped photosensitive structure and the emitter and the collector.

6. The structure of claim 5, wherein the T-shaped photosensitive structure extends between the spacers and directly contacts the intrinsic base within the trench, and extends laterally over the spacers, and is surrounded by ion implanted semiconductor material on sides thereof.

7. The structure of claim 6, further comprising a waveguide structure in contact with the intrinsic base and coupled to the T-shaped photosensitive structure.

8. The structure of claim 1, wherein the T-shaped photosensitive structure comprises Ge material.

9. The structure of claim 1, wherein the lateral bipolar transistor comprises semiconductor material of a semiconductor on insulator substrate which surrounds the trench and the T-shaped photosensitive structure.

10. The structure of claim 1, further comprising a waveguide structure coupled to the T-shaped photosensitive structure and isolated with insulator material of a shallow trench isolation structure and an underlying buried insulator layer.

11. The structure of claim 10, wherein the waveguide structure comprises semiconductor material of a semiconductor on insulator substrate.

12. A structure comprising:
- a lateral bipolar transistor comprising a laterally connected intrinsic base, emitter and collector comprising a top semiconductor layer of a semiconductor on insulator substrate;
- a T-shaped photosensitive structure within a trench of the intrinsic base and extending vertically above and in direct contact with the intrinsic base; and
- a spacer above the emitter and the collector which is isolating the T-shaped photosensitive structure from both the emitter and the collector.

13. The structure of claim 12, wherein the T-shaped photosensitive structure is above the spacers and includes a region which laterally extends over the spacers.

14. The structure of claim 13, wherein the T-shaped photosensitive structure extends into the trench of the intrinsic base, between the spacers, and a portion of the T-shaped photosensitive structure and the trench are surrounded by semiconductor material.

15. The structure of claim 12, wherein the T-shaped photosensitive structure comprises Ge material.

16. The structure of claim 12, further comprising a waveguide structure coupled to the intrinsic base.

17. The structure of claim 16, wherein the waveguide structure is coupled to the T-shaped photosensitive structure and isolated with insulator material of a shallow trench isolation structure and an underlying buried insulator layer below the top semiconductor layer of the semiconductor on insulator substrate.

18. The structure of claim 16, wherein the waveguide structure is perpendicular to the emitter and the collector.

19. A method comprising:
- forming a lateral bipolar transistor comprising a laterally connected intrinsic base, emitter and collector comprising a top semiconductor layer of a semiconductor on insulator substrate;
- forming a T-shaped photosensitive structure within a trench of the intrinsic base and extending vertically above and in direct contact with intrinsic base; and
- forming a spacer above the emitter and the collector which is isolating the T-shaped photosensitive structure from both the emitter and the collector.

* * * * *